(12) United States Patent
Morimoto et al.

(10) Patent No.: US 8,455,765 B2
(45) Date of Patent: Jun. 4, 2013

(54) LAMINATED BODY, METHOD OF MANUFACTURING SUBSTRATE, SUBSTRATE, AND SEMICONDUCTOR DEVICE

(75) Inventors: Junpei Morimoto, Utsunomiya (JP); Kenichi Kaneda, Utsunomiya (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 320 days.

(21) Appl. No.: 12/523,391

(22) PCT Filed: Jan. 23, 2008

(86) PCT No.: PCT/JP2008/050889
§ 371 (c)(1),
(2), (4) Date: Jul. 16, 2009

(87) PCT Pub. No.: WO2008/093579
PCT Pub. Date: Aug. 7, 2008

(65) Prior Publication Data
US 2010/0044081 A1 Feb. 25, 2010

(30) Foreign Application Priority Data
Jan. 29, 2007 (JP) .................................. 2007-018555

(51) Int. Cl.
*H05K 1/09* (2006.01)
(52) U.S. Cl.
USPC .................. 174/251; 428/301.1; 428/138
(58) Field of Classification Search
USPC .................. 174/251; 428/301.1, 138
See application file for complete search history.

(56) References Cited

U.S. PATENT DOCUMENTS

| 6,673,190 B2* | 1/2004 | Haas et al. ............... 156/289 |
| 2004/0234741 A1* | 11/2004 | Hosomi et al. ........... 428/292.1 |

(Continued)

FOREIGN PATENT DOCUMENTS

| JP | 3-165594 | 7/1991 |
| JP | 10-247782 | 9/1998 |

(Continued)

OTHER PUBLICATIONS

International Search Report.

(Continued)

*Primary Examiner* — Hung S Bui
*Assistant Examiner* — James Wu
(74) *Attorney, Agent, or Firm* — Smith, Gambrell & Russell, LLP

(57) ABSTRACT

A laminated body of the present invention includes a resin layer in which a core portion composed of a fiber base member having a thickness of 25 μm or less is embedded, the resin layer having two surfaces, and the resin layer through which at least one via-hole is adapted to be formed, and a metal layer bonded to at least one of the two surfaces of the resin layer, and the metal layer having at least one opening portion provided so as to correspond to the via-hole to be formed. Further, a method of manufacturing a substrate of the present invention includes preparing the above laminated body, forming the via-hole so as to pass through the resin layer by irradiating a laser beam onto the resin layer, and removing the metal layer from the resin layer after the via-hole is formed. Further, a substrate of the present invention is manufactured by using the above method. Furthermore, a semiconductor device of the present invention includes the above substrate, and a semiconductor element mounted on the substrate.

12 Claims, 9 Drawing Sheets

U.S. PATENT DOCUMENTS

2005/0218503 A1* 10/2005 Abe et al. .................. 257/700
2007/0207337 A1* 9/2007 Nagatani .................. 428/607

FOREIGN PATENT DOCUMENTS

| | | |
|---|---|---|
| JP | 2002-314254 | 10/2002 |
| JP | 2003-313324 | 11/2003 |
| JP | 2005-132857 | 5/2005 |
| JP | 2007002071 A * | 1/2007 |
| KR | 2005-62654 | 6/2005 |
| WO | 2004/064467 A1 | 7/2004 |
| WO | WO 2007126130 A1 * | 11/2007 |

OTHER PUBLICATIONS

Korean Office Action issued on Dec. 16, 2010 for Korean Application No. 10-2009-7014646.

* cited by examiner (a)

(b)

LAMINATED BODY, METHOD OF MANUFACTURING SUBSTRATE, SUBSTRATE, AND SEMICONDUCTOR DEVICE

FIELD OF THE INVENTION

The present invention relates to a laminated body, a method of manufacturing a substrate, a substrate, and a semiconductor device.

BACKGROUND

Electronic devices are becoming increasingly smaller and faster, as a result of which high-density packaging and high-density wiring of a multilayer printed wiring board are promoted. This requires that wirings provided in the multilayer printed wiring board are thinly formed and through-holes provided therein are minutely formed. In order to satisfy these requirements, a buildup-type multilayer printed wiring board is used.

A rigid double-sided substrate or multilayer substrate in which a fiber base member is utilized is widely used as an internal layer which serves as a core of the multilayer printed wiring board. Further, insulating resin layers to be laminated on such a substrate are provided using a method of repeatedly coating a resin material onto the substrate, a method of laminating resin films onto the substrate or a method of laminating copper foils with the resin material onto the substrate.

In this case, in general, the fiber base member is not embedded in each of the insulating resin layers laminated. However, it has become clear that the buildup-type multilayer printed wiring board having such a structure has the following problems. Namely, cracks easily occur within the resin layer (hereinafter, referred to as "buildup layer" on occasion) in which the fiber base member is not embedded. Further, in the case where thermal shock is applied to the buildup layer, cracks also easily occur therewithin due to thermal expansion and contraction of the resin material constituting the buildup layer.

For these reasons, it has been examined that the fiber base member is embedded in the buildup layer. However, in the case where the buildup layer in which the fiber base member is embedded is used, when through-holes (via-holes) are formed therethrough using laser, smear is generated on a surface of the buildup layer or inner surfaces of the through-holes, as a result of which circuit deficits occur. Hereinabove, in order to improve laser workability of the buildup layer in which the fiber base member is embedded, a method of using an organic fiber base member as the fiber base member is proposed (see, for example, Japanese Patent Application Laid-open No. Hei 11-330707).

However, in the case of the method of using the organic fiber base member, since the organic fiber base member has only low rigidity, it is sometimes difficult to make the buildup-type multilayer printed wiring board thinner.

SUMMARY OF THE INVENTION

In order to improve such a problem, the present inventors have developed a buildup layer in which a glass fiber base member having very thin thickness is used. This makes it possible to improve the laser workability of the buildup layer to a certain degree. However, even if the glass fiber base member having thin thickness is used, the generation of the smear cannot be suppressed completely. It is therefore an object of the present invention to improve laser workability of a resin layer (buildup layer), in which a fiber base member having a thickness of 25 µm or less is used, by sufficiently suppressing generation of smear during subjecting the resin layer to a laser processing.

In order to achieve the object, the present invention includes the following features (1) to (13):

(1) A laminated body, comprising:
a resin layer in which a core portion composed of a fiber base member having a thickness of 25 µm or less is embedded, the resin layer having two surfaces, and the resin layer through which at least one via-hole is adapted to be formed; and
a metal layer bonded to at least one of the two surfaces of the resin layer, and the metal layer having at least one opening portion provided so as to correspond to the via-hole to be formed.

(2) The laminated body according to the above feature (1), wherein the fiber base member is a glass fiber base member.

(3) The laminated body according to the above feature (1), wherein a metal constituting the metal layer is at least one of copper and copper-based metal alloy.

(4) The laminated body according to the above feature (1), wherein the resin layer is formed of a resin composition containing cyanate resin.

(5) The laminated body according to the above feature (1), wherein the fiber base member is located close to one of the surfaces of the resin layer in a thickness direction thereof.

(6) The laminated body according to the above feature (5), wherein the resin layer includes the core portion having one surface and the other surface opposite to the one surface, a first resin layer provided on a side of the one surface of the core portion and having a thickness of 5 to 15 µm, and a second resin layer provided on a side of the other surface of the core portion and having a thickness of 15 to 50 µm.

(7) The laminated body according to the above feature (6), wherein a first resin composition constituting the first resin layer is different from a second composition constituting the second resin layer.

(8) A method of manufacturing a substrate, comprising:
preparing the laminated body defined by claim 1;
forming the via-hole so as to pass through the resin layer by irradiating a laser beam onto the resin layer; and
removing the metal layer from the resin layer after the via-hole is formed.

(9) The method according to the above feature (8), wherein the via-hole has a first opening positioned on a side of the metal layer and having a diameter of 55 to 85 µm and a second opening positioned on an opposite side from the metal layer and having a diameter of 35 to 65 µm.

(10) A substrate manufactured by using the method according to the above feature (8).

(11) A substrate, comprising:
a core substrate having two surfaces;
a circuit wiring portion formed on a side of at least one of the two surfaces of the core substrate; and
a resin layer provided on the circuit wiring portion,
wherein the resin layer includes a core portion composed of a fiber base member, the core portion having a thickness of 25 µm or less and having one surface and the other surface opposite to the one surface, a first resin layer formed on a side of the one surface of the core portion, and a second resin layer formed on a side of the other surface of the core portion, and
the circuit wiring portion is provided so as to be embedded into a part of the second resin layer.

(12) The substrate according to the above feature (11), wherein in the case where a thickness of the first resin layer is defined as "B2 ($\leq$m)", a thickness of the second resin layer which is not positioned between the circuit wiring portion and the core portion is defined as "B1 (µm)", a thickness of the circuit wiring portion is defined as "t1 (µm)", a residual copper ratio of the circuit wiring portion is defined as "S (%)", and a thickness of the second resin layer which is positioned between the circuit wiring portion and the core portion is defined as "t2 (μm)", B1, B2, t1 and t2 satisfy a relationship of B2<B1 and B1=t2+t1×(1−S/100).

(13) A semiconductor device, comprising:

the substrate according to the above feature (10); and a semiconductor element mounted on the substrate.

BEST MODE FOR CARRYING OUT THE INVENTION

Hereinbelow, description will be made on a laminated body, a method of manufacturing a substrate, a substrate, and a semiconductor device according to the present invention.

The laminated body according to the present invention comprises a resin layer in which a core portion composed of a fiber base member having a thickness of 25 μm or less is embedded, the resin layer having two surfaces, and the resin layer through which a via-hole is adapted to be formed, and a metal layer bonded to at least one of the two surfaces of the resin layer, and the metal layer having an opening portion provided so as to correspond to the via-hole to be formed.

Further, the method of manufacturing a substrate according to the present invention comprises preparing the above laminated body, forming the via-hole so as to pass through the resin layer by irradiating a laser beam onto the resin layer, and removing the metal layer from the resin layer after the via-hole is formed.

Further, the substrate according to the present invention is manufactured by using the above method.

Furthermore, the semiconductor device according to the present invention comprises the above substrate, and a semiconductor element mounted on the substrate.

(Laminated Body)

First, the laminated body will be described.

Figure 1:
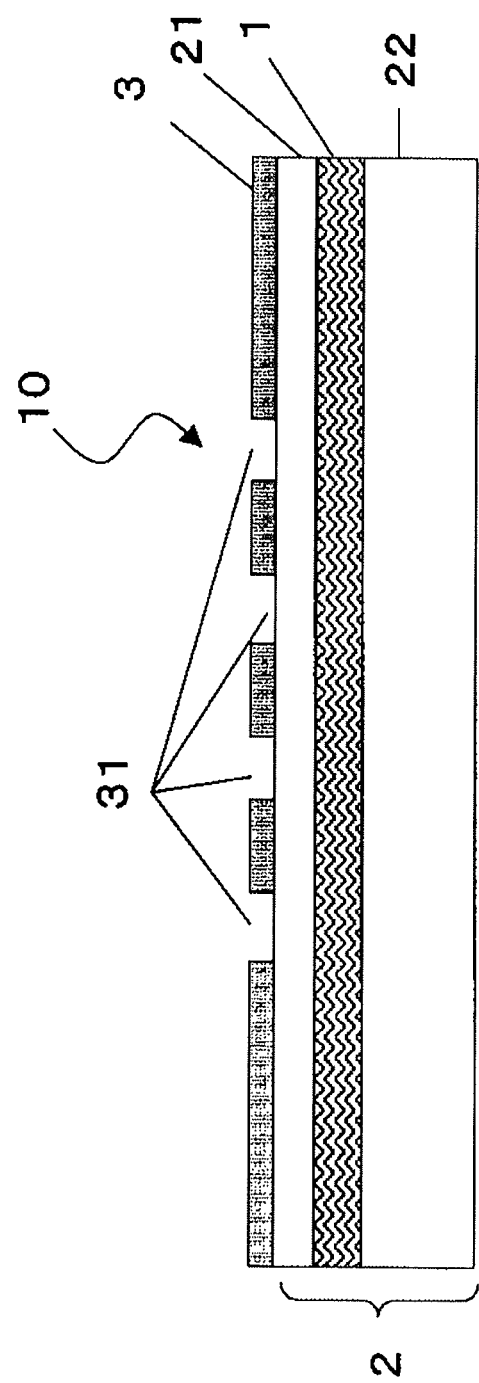
FIG. 1 is a sectional view showing one example of a laminated body according to the present invention.

As shown in FIG. 1, a laminated body 10 includes a resin layer 2 in which a core portion 1 composed of a fiber base member is embedded and a metal layer 3 bonded to one surface of the resin layer 2.

The resin layer 2 includes a first resin layer 21 formed on a side of one surface of the core portion 1 and a second resin layer 22 formed on a side of the other surface of the core portion 1.

The metal layer 3 is bonded to the first resin layer 21.

Further, opening portions 31 are formed through the metal layer 3 so as to correspond to via-holes to be formed through the resin layer 2 as described below.

(Core Portion)

The Fiber Base Member Constituting the Core Portion 1 is characterized in that a thickness thereof is 25 μm or less. This makes it possible to improve laser workability of the resin layer 2 and to reduce a thickness of the resin layer 2.

In general, it was difficult to use the fiber base member having the thickness of 25 μm or less as the core portion 1 of the resin layer 2. In the present invention, use of a method described below makes it possible to embed the fiber base member having the thickness of 25 μm or less in the resin layer 2 as the core portion 1. The present invention tries to solve new problems which occurred with embedding of the fiber base member in the resin layer 2.

Examples of the fiber base member include: a glass fiber base member such as a glass woven cloth or a glass non-woven cloth; a synthetic fiber base member formed from a woven or non-woven cloth mainly made of polyamide-based resin fibers (e.g., polyamide resin fibers, aromatic polyamide resin fibers and wholly aromatic polyamide resin fibers), polyester-based resin fibers (e.g., polyester resin fibers, aromatic polyester resin fibers and wholly aromatic polyester resin fibers), polyimide resin fibers or fluorocarbon resin fibers; a paper base member mainly formed from kraft paper, cotton linter paper or blended paper of linter and kraft pulp; and the like. Among these fiber base members, the glass fiber base member is preferably used. By using such a glass fiber base member, it is possible to improve rigidity of the resin layer 2 and to reduce the thickness of the resin layer 2. In addition, it is also possible to reduce a thermal expansion coefficient of the resin layer 2. This makes it possible to reduce occurrence of a warp of a substrate manufactured using the resin layer 2.

Examples of a glass material for forming the glass fiber base member include E glass, C glass, A glass, S glass, D glass, NE glass, T glass, H glass, and the like. Among these glass materials, the T glass is preferably used. By using such a T glass, it is possible to reduce a thermal expansion coefficient of the glass fiber base member. This makes it possible to reduce a thermal expansion coefficient of the resin layer 2.

The thickness of the fiber base member is 25 μm or less, but is preferably in the range of 3 to 20 μm, and more preferably in the range of 10 to 18 μm. In the case where the fiber base member has such a thickness, the resin layer 2 can have rigidity and laser workability in an excellent balance.

The core portion 1 does not have to be located at a specific position of the resin layer 2, but is preferably located close to one surface of the resin layer 2 in a thickness direction thereof. In such a structure, it is possible to adjust an amount of a resin material constituting each of the first and second resin layers 21 and 22 depending on a size and the like of a circuit wiring portion (circuit pattern) to be embedded therein. By appropriately adjusting the amount of the resin material constituting each of the first and second resin layers 21 and 22, the thickness of the resin layer 2 can be further reduced.

Figure 2:
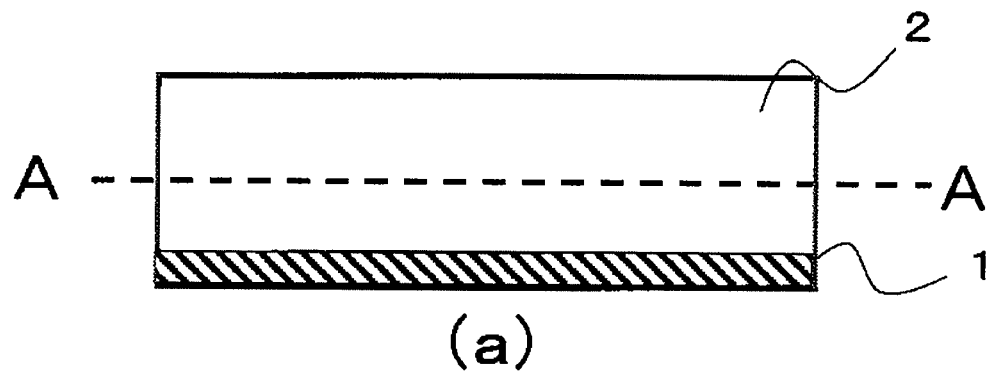
FIGS. 2(a) and 2(b) are sectional views each showing one example of the laminated body according to the present invention.
Figure 2:
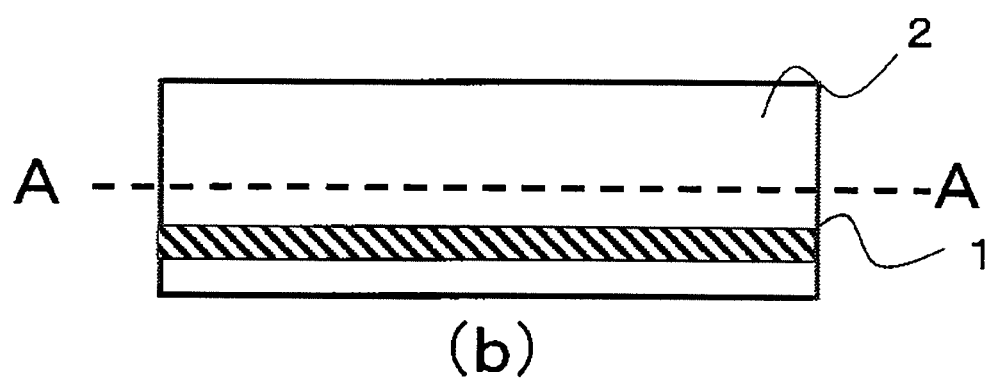

Here, description will be made on a state that the core portion 1 is located close to the one surface of the resin layer 2 (unevenly distributed) in the thickness direction thereof with reference to FIGS. 2(a) and 2(b). FIGS. 2(a) and 2(b) are sectional views each schematically showing the state that the core portion 1 is located close to the one surface of the resin layer 2 in the thickness direction thereof. As shown in FIGS. 2(a) and 2(b), a center of each core portion 1 is dislocated from a center line A-A of the resin layer 2 in the thickness direction thereof. As shown in FIG. 2(a), the core portion 1 is provided in the resin layer 2 in a state that a lower surface (in FIG. 2(a)) of the core portion 1 is located so as to substantially correspond to a lower surface (in FIG. 2(a)) of the resin layer 2. On the other hand, in the resin layer 2 shown in FIG. 2(b), the core portion 1 is provided between the center line A-A of the resin layer 2 and the lower surface (in FIG. 2(b)) of the resin layer 2. In this regard, it is to be noted that the core portion 1 may be located so that a part of the core portion 1 overlaps the center line A-A of the resin layer 2. For example, in the case where an upper surface of the core portion 1 is located close to an upper surface of the resin layer 2, the resin layer 2 can be processed from an upper side thereof using laser while reducing impact to a metal layer provided on a lower side of the resin layer 2. This makes it possible to improve the laser workability of the resin layer 2.

(Resin Layer)

The core portion 1 is embedded in the resin layer 2. It is preferred that, for example, the resin layer 2 is formed of a resin composition containing a thermosetting resin. This makes it possible to improve heat resistance of the resin layer 2.

Examples of the thermosetting resin include: phenolic resin such as novolak type phenolic resin (e.g., phenol novolak resin, cresol novolak resin, bisphenol A novolak resins), or resol type phenolic resin (e.g., non-modified resol phenolic resin, oil-modified resol phenolic resin modified with oil such as wood oil, linseed oil or walnut oil); epoxy resin such as bisphenol type epoxy resin (e.g., bisphenol A epoxy resin, bisphenol F epoxy resin), novolak type epoxy resin (e.g., novolak epoxy resin, cresol novolak epoxy resin), or biphenyl-type epoxy resin; urea resin; triazine ring-containing resin such as melamine resin; unsaturated polyester resin; bismaleimide resin; polyurethane resin; diallylphthalate resin; silicone resin; benzoxazine ring-containing resin; cyanate resin; and the like.

Among these thermosetting resins, cyanate resin (which may be prepolymer thereof) is more preferably used. By using such cyanate resin, it is possible to reduce a thermal expansion coefficient of the resin layer 2. In addition, it is also possible to allow the resin layer 2 to have excellent electric properties such as low-dielectric constant and low dielectric loss tangent, and the like.

The cyanate resin can be obtained by, for example, a reaction of cyanogen halide and phenol to thereby produce a prepolymer. If necessary, a heat treatment may be carried out during the reaction. Specifically, examples of such cyanate resin include novolak type cyanate resin, bisphenol type cyanate resin such as bisphenol A type cyanate resin, bisphenol E type cyanate resin or tetramethyl bisphenol F type cyanate resin, and the like. Among these cyanate resins, the novolak type cyanate resin is preferably used. By using the novolak type cyanate resin, when the resin composition (resin layer 2) has been cured, heat resistance thereof is improved due to increase of a crosslinking density of the novolak type cyanate resin and flame retardancy thereof is also improved. This is because the novolak type cyanate resin forms triazine rings by a curing reaction thereof. Further, this is also because the novolak type cyanate resin has a high content of benzene rings due to its structure, thereby easily carbonizing the benzene rings contained in the novolak type cyanate resin. In addition, by using the novolak type cyanate resin, it is also possible for the resin layer 2 to have excellent rigidity, even in the case where the resin layer 2 has a reduced thickness (e.g., 35 µm or less). The cured resin layer 2 offers excellent rigidity particularly upon heating, and therefore it offers especially excellent reliability when a semiconductor element is mounted thereon.

As the novolak type cyanate resin, one represented by, for example, the following formula (I) can be used.

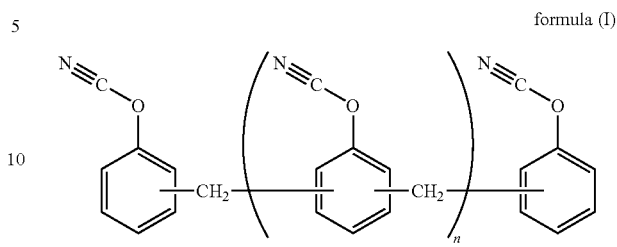

formula (I)

wherein "n" is any integer.

An average number of repeating units "n" of the novolak type cyanate resin represented by the above formula (I) is not particularly limited to a specific value, but is preferably in the range of 1 to 10, and more preferably in the range of 2 to 7. If the average number of the repeating units "n" is less than the above lower limit value, the novolak type cyanate resin tends to be easily crystallized, thereby relatively reducing solubility of the novolak type cyanate resin in general purpose-solvents. As a result, there is a case that it becomes difficult to handle the novolak type cyanate resin. On the other hand, if the average number of the repeating units "n" exceeds the above upper limit value, a melt viscosity of the novolak type cyanate resin becomes too high, and therefore there is a case that moldability of the resin layer 2 is reduced.

A weight average molecular weight of the cyanate resin is not particularly limited to a specific value, but is preferably in the range of 500 to 4,500, and more preferably in the range of 600 to 3,000. If the weight average molecular weight of the cyanate resin is less than the above lower limit value, since the resin layers 2 are likely to become tacky, there is a case that when one resin layer 2 makes contact with another resin layer 2, the resin layers 2 adhere to each other, or the resin composition of the one resin layer 2 is transferred to the other resin layer 2. On the other hand, if the weight average molecular weight of the cyanate resin exceeds the above upper limit value, there is a case that a reaction rate of the cyanate resin becomes too high, thereby causing defective molding of a substrate (especially, circuit substrate) or lowering interlayer peel strength of the substrate.

In this regard, it is to be noted that the weight average molecular weight of the cyanate resin can be measured using, for example, a GPC (gel permeation chromatography).

This measurement is carried out by using HLC-8200GPC (produced by TOSOH CORPORATION) as measurement equipment, TSK=GEL polystyrene as a column and THF (tetrahydrofuran) as a solvent.

An amount of the thermosetting resin contained in the resin composition is not particularly limited to a specific value, but is preferably in the range of 5 to 50 wt %, and more preferably in the range of 20 to 40 wt % with respect to a total weight of the resin composition. If the amount of the thermosetting resin contained in the resin composition is less than the above lower limit value, there is a case that it becomes difficult to form the resin layer 2. On the other hand, if the amount of the thermosetting resin contained in the resin composition exceeds the above upper limit value, there is a case that mechanical strength of the resin layer 2 is lowered.

The resin composition preferably contains an inorganic filler. This makes it possible to obtain a resin layer 2 having high mechanical strength while having a reduced thickness (e.g., 35 µm or less). In addition, it is also possible to allow the resin layer 2 to have lower thermal expansivity.

Examples of the inorganic filler include talc, alumina, glass, silica, mica, aluminum hydroxide, magnesium hydroxide, and the like. Among these inorganic fillers, the silica is preferably used. From the viewpoint of excellent low thermal expansivity, molten silica (especially, spherical molten silica) is preferably used. The inorganic filler (that is, the particles thereof) may have a crushed shape or a spherical shape, but a shape of the inorganic filler is appropriately selected according to its purpose of use. For example, in order to impregnate the fiber base member with the resin composition reliably, it is preferred that a melt viscosity of the resin composition is reduced. In this case, spherical silica is preferably used as the inorganic filler.

An average particle size of the inorganic filler is not particularly limited to a specific value, but is preferably in the range of 0.01 to 5.0 μm, and more preferably in the range of 0.2 to 2.0 μm. If the average particle size of the inorganic filler is less than the above lower limit value, there is a case that a viscosity of a varnish for forming the resin layer 2 becomes high, thereby affecting workability during formation of the resin layer 2. On the other hand, if the average particle size of the inorganic filler exceeds the above upper limit value, there is a case that a phenomenon such as sedimentation of the inorganic filler in the varnish for forming the resin layer 2 occurs.

In this regard, it is to be noted that the average particle size of the inorganic filler can be measured by, for example, a particle size distribution analyzer ("LA-500" produced by HORIBA).

As the inorganic filler, spherical silica (especially, spherical molten silica) is preferably used. An average particle size of the spherical molten silica is preferably 5.0 μm or less, and more preferably in the range of 0.01 to 2.0 μm. By using such spherical silica as the inorganic filler, it is possible to improve a filling factor (packing density) of the inorganic filler within the resin layer 2.

In the case where the inorganic filler is used, an amount of the inorganic filler contained in the resin composition is not particularly limited to a specific value, but is preferably in the range of 20 to 70 wt %, and more preferably in the range of 30 to 50 wt % with respect to the total weight of the resin composition. By setting the amount of the inorganic filler contained in the resin composition to a value within the above range, it is possible to give especially excellent low thermal expansivity and low water-absorption properties to the resin layer 2.

In the case where the cyanate resin (especially, novolak type cyanate resin) is used as the thermosetting resin, epoxy resin (which contains substantially no halogen atom) is preferably used in combination with the cyanate resin. Examples of the epoxy resin include phenol novolak type epoxy resin, bisphenol type epoxy resin, naphthalene type epoxy resin, aryl alkylene type epoxy resin, and the like. Among these epoxy resins, the aryl alkylene type epoxy resin is preferably used. By using such epoxy resin, it is possible for the cured resin layer 2 to have improved solder heat resistance after moisture absorption and flame retardancy.

The aryl alkylene type epoxy resin is epoxy resin having one or more aryl alkylene groups in one repeating unit. Examples of such aryl alkylene type epoxy resin include xylylene type epoxy resin, biphenyl dimethylene type epoxy resin, and the like. Among these aryl alkylene type epoxy resins, the biphenyl dimethylene type epoxy resin is preferably used. The biphenyl dimethylene type epoxy resin can be represented by, for example, the following formula (II).

formula (II)

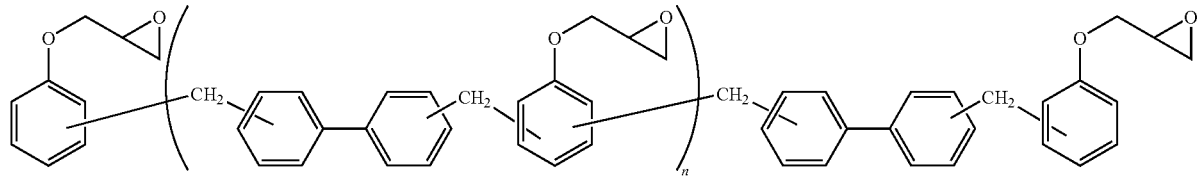

wherein "n" is any integer.

An average number of repeating units "n" of the biphenyl dimethylene type epoxy resin represented by the above formula (II) is not particularly limited to a specific value, but is preferably in the range of 1 to 10, and more preferably in the range of 2 to 5. If the average number of the repeating units "n" is less than the above lower limit value, the biphenyl dimethylene type epoxy resin tends to be easily crystallized, thereby relatively reducing solubility of the biphenyl dimethylene type epoxy resin in general purpose-solvents. As a result, there is a case that it becomes difficult to handle the biphenyl dimethylene type epoxy resin. On the other hand, if the average number of the repeating units "n" exceeds the above upper limit value, there is a case that flowability of the biphenyl dimethylene type epoxy resin is lowered, thereby causing defective molding of the resin layer 2, and the like.

In the case where the epoxy resin is used in combination with the cyanate resin, an amount of the epoxy resin contained in the resin composition is not particularly limited to a specific value, but is preferably in the range of 1 to 55 wt %, and more preferably in the range of 5 to 40 wt % with respect to the total weight of the resin composition. If the amount of the epoxy resin contained in the resin composition is less than the above lower limit value, there is a case that reactivity of the cyanate resin is lowered or moisture resistance of the resin layer 2 is lowered. On the other hand, if the amount of the epoxy resin contained in the resin composition exceeds the above upper limit value, there is a case that heat resistance of the resin layer 2 is lowered.

A weight average molecular weight of the epoxy resin is not particularly limited to a specific value, but is preferably in the range of 500 to 20,000, and more preferably in the range of 800 to 15,000. If the weight average molecular weight of the epoxy resin is less than the above lower limit value, there is a case that the resin layer 2 becomes tacky. On the other hand, if the weight average molecular weight of the epoxy resin exceeds the above upper limit value, there is a case that it becomes difficult to impregnate the fiber base member with the resin composition when forming the resin layer 2, and therefore a resin layer 2 having uniform thickness and uniform quality cannot be obtained.

In this regard, it is to be noted that the weight average molecular weight of the epoxy resin can be measured using, for example, the GPC (gel permeation chromatography).

This measurement is carried out by using HLC-8200GPC (produced by TOSOH CORPORATION) as measurement equipment, TSK=GEL polystyrene as a column and THF (tetrahydrofuran) as a solvent.

Further, in the case where the cyanate resin (especially, novolak type cyanate resin) is used as the thermosetting resin, phenolic resin is preferably used in combination with the cyanate resin. Examples of the phenolic resin include novolak type phenolic resin, resol type phenolic resin, aryl alkylene type phenolic resin, and the like. Among these phenolic resins, the aryl alkylene type phenolic resin is preferably used. By using such phenolic resin, it is possible to allow the cured resin layer 2 to have improved solder heat resistance after moisture absorption.

Examples of the aryl alkylene type phenolic resin include xylylene type phenolic resin, biphenyl dimethylene type phenolic resin, and the like. The biphenyl dimethylene type phenolic resin can be represented by, for example, the following formula (III).

In this regard, it is to be noted that the weight average molecular weight of the phenolic resin can be measured using, for example, the GPC (gel permeation chromatography).

Further, by using the cyanate resin (especially, novolak type cyanate resin), the phenolic resin (aryl alkylene type phenolic resin, especially, biphenyl dimethylene type phenolic resin), and the epoxy resin (aryl alkylene type epoxy resin, especially, biphenyl dimethylene type epoxy resin) in combination, it is possible to obtain a resin layer 2 capable of manufacturing a substrate (especially, circuit substrate) having especially excellent dimensional stability.

formula (III)

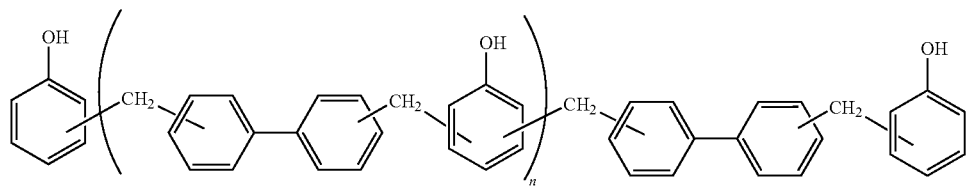

wherein "n" is any integer.

An average number of repeating units "n" of the biphenyl dimethylene type phenolic resin represented by the above formula (III) is not particularly limited to a specific value, but is preferably in the range of 1 to 12, and more preferably in the range of 2 to 8. If the average number of the repeating units "n" of the biphenyl dimethylene type phenolic resin is less than the above lower limit value, there is a case that heat resistance of the resin layer 2 is lowered. On the other hand, if the average number of the repeating units "n" of the biphenyl dimethylene type phenolic resin exceeds the above upper limit value, there is a case that mutual solubility between the biphenyl dimethylene type phenolic resin and another resin tends to be lowered, thereby lowering workability during the formation of the resin layer 2.

By using the cyanate resin (especially, novolak type cyanate resin) in combination with the aryl alkylene type phenolic resin, it is possible to control crosslink density of the cured resin composition (cured resin layer 2), thereby improving adhesiveness between the metal layer 3 and the resin layer 2.

In the case where the phenolic resin is used in combination with the cyanate resin, an amount of the phenolic resin contained in the resin composition is not particularly limited to a specific value, but is preferably in the range of 1 to 55 wt %, and more preferably in the range of 5 to 40 wt % with respect to the total weight of the resin composition. If the amount of the phenolic resin contained in the resin composition is less than the above lower limit value, there is a case that heat resistance of the resin layer 2 is lowered. On the other hand, if the amount of the phenolic resin contained in the resin composition exceeds the above upper limit value, there is a case that low thermal expansivity of the resin layer 2 is impaired.

A weight average molecular weight of the phenolic resin is not particularly limited to a specific value, but is preferably in the range of 400 to 18,000, and more preferably in the range of 500 to 15,000. If the weight average molecular weight of the phenolic resin is less than the above lower limit value, there is a case that the resin layer 2 becomes tacky. On the other hand, if the weight average molecular weight of the phenolic resin exceeds the above upper limit value, there is a case that it becomes difficult to impregnate the fiber base member with the resin composition when forming the resin layer 2, and therefore a resin layer 2 having uniform thickness and uniform quality cannot be obtained.

The resin composition preferably contains a coupling agent, if needed. The coupling agent has a function of improving wettability of an interface between the thermosetting resin and the inorganic filler. This makes it possible to uniformly fix the thermosetting resin and the inorganic filler to the fiber base member. As a result, it is possible to improve heat resistance of the resin layer 2, especially, solder heat resistance after moisture absorption of the cured resin layer 2.

The coupling agent is not particularly limited to a specific type as long as it is generally used. Examples of such a coupling agent include an epoxy silane coupling agent, a cationic silane coupling agent, an amino silane coupling agent, a titanate-based coupling agent, a silicone oil type coupling agent, and the like, and one or more of these curing agents are preferably used. By using such a coupling agent, it is possible to enhance the wettability of the interface between the thermosetting resin and the inorganic filler, thereby further improving the heat resistance of the resin layer 2.

In the case where the coupling agent is added to the resin composition, an amount of the coupling agent contained in the resin composition is not particularly limited to a specific value, because it can be set to a desired value depending on a surface area of the inorganic filler used. However, it is preferably in the range of 0.05 to 3 parts by weight, and more preferably in the range of 0.1 to 2 parts by weight with respect to 100 parts by weight of the inorganic filler. If the amount of the coupling agent contained in the resin composition is less than the above lower limit value, there is a case that it is impossible to sufficiently cover the surface of the inorganic filler with the coupling agent, thereby reducing the effect of improving the heat resistance of the resin layer 2. On the other hand, if the amount of the coupling agent contained in the resin composition exceeds the above upper limit value, there is a case that the coupling agent affects a curing reaction of the thermosetting resin, thereby reducing bending strength of the cured resin layer 2.

If necessary, the resin composition may contain a curing accelerator. As the curing accelerator, a well-known one can be used. Examples of such a curing accelerator include: organometallic salt such as zinc naphthenate, cobalt naphthenate, tin octylate, cobalt octylate, cobalt (II) bisacetyl acetonate, or cobalt (III) triacetyl acetonate; tertiary amine such as triethyl amine, tributyl amine, or diazabicyclo[2,2,2]octane; imidazole such as 2-phenyl-4-methyl imidazole, 2-ethyl-4-ethyl imidazole, 2-phenyl-4-methyl imidazole, 2-phenyl-4-methyl-5-hydroxy imidazole, or 2-phenyl-4,5-dihydroxy imidazole; a phenol compound such as phenol, bisphenol A, or nonyl phenol; organic acid such as acetic acid, benzoic acid, salicylic acid, or paratoluenesulfonic acid; a mixture thereof; and the like.

In the case where the curing accelerator is added to the resin composition, an amount of the curing accelerator contained in the resin composition is not particularly limited to a specific value, but is preferably in the range of 0.01 to 5 wt %, and more preferably in the range of 0.05 to 2 wt % with respect to the total weight of the resin composition. If the amount of the curing accelerator contained in the resin composition is less than the above lower limit value, there is a case that an effect of accelerating a curing reaction of the thermosetting resin cannot be sufficiently exhibited. On the other hand, if the amount of the curing accelerator contained in the resin composition exceeds the above upper limit value, there is a case that storage stability of the resin layer 2 is reduced.

In this regard, it is to be noted that the resin composition may contain thermoplastic resin to be used in combination with the thermosetting resin. Examples of the thermoplastic resin include phenoxy resin, polyimide resin, polyamideimide resin, polyphenylene oxide resin, polyethersulfone resin, and the like.

Further, if necessary, the resin composition may further contain one or more additives in addition to the above-described components. Examples of such additives include a pigment, an antioxidant, and the like.

The structure of the resin layer 2 is not particularly limited to a specific one. As described above, the resin layer 2 includes the first resin layer 21 formed on the side of the one surface of the core portion 1 and the second resin layer 22 formed on the side of the other surface of the core portion 1. In this case, a first resin composition constituting the first resin layer 21 may be the same as or different from a second composition constituting the second resin layer 22.

In the case where the first resin composition and the second composition are different from each other, a different function can be imparted to each of the first and second resin layers 21 and 22.

Further, in the case where the first resin composition and the second composition are the same with each other, it is possible to improve dimensional stability of the resin layer 2 and to reduce a warp of the substrate manufactured.

A thickness of the first resin layer 21 is not particularly limited to a specific value, but is preferably in the range of 5 to 15 μm, and more preferably in the range of 8 to 10 μm. On the other hand, a thickness of the second resin layer 22 is not also particularly limited to a specific value, but is preferably in the range of 15 to 50 μm, and more preferably in the range of 25 to 35 μm. In this regard, it is to be noted that the thickness of each of the first and second resin layers 21 and 22 can be appropriately adjusted depending on a residual copper ratio of a circuit wiring portion to be laminated thereon.

In general, the resin layer 2 is used as a buildup layer of the circuit board including the circuit wiring portion (circuit wiring). In this case, the resin layer 2 is used so as to be embedded into the circuit wiring portion.

Figure 3:
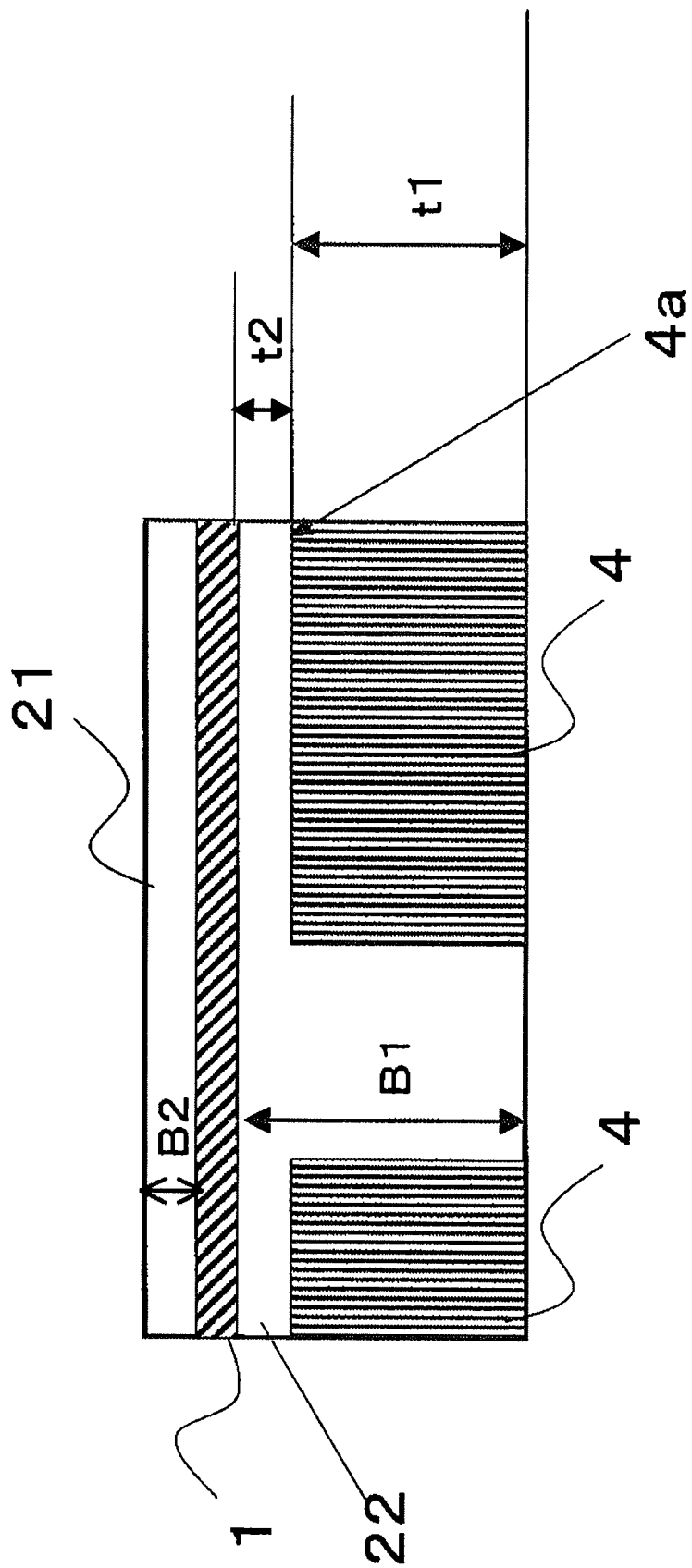
FIG. 3 is a sectional view schematically showing a state that a resin layer is embedded in a circuit wiring portion.

FIG. 3 shows a state that the resin layer 2 is embedded in the circuit wiring portion 4. In the case where the thickness of the first resin layer 21 is defined as "B2 (μm)", the thickness of the second resin layer 22 which is not positioned between the circuit wiring portion 4 and the core portion 1 is defined as "B1 (μm)", a thickness of the circuit wiring portion 4 is defined as "t1 (μm)", a residual copper ratio of the circuit wiring portion 4 is defined as "S (%)", and the thickness of the second resin layer 22 which is positioned between the circuit wiring portion 4 (an upper surface 4a thereof) and the core portion 1 is defined as "t2 (μm)", B1, B2, t1 and t2 preferably satisfy a relationship of $B2 < B1$ and $B1 = t2 + t1 \times (1 - S/100)$.

Here, the thickness "t2" is not particularly limited to a specific value, but is preferably in the range of 0 to 15 μm. Further, in the case where there is a risk that insulation between the circuit wiring portion 4 and the core portion 1 is reduced so as to cause possible contact therebetween, the thickness "t2" is preferably set to be a value in the range of 3 to 15 μm. On the other hand, from the viewpoint of further reducing the thickness of the resin layer 2, the thickness "t2" is preferably set to a value in the range of 0 to 5 μm. Especially, from the viewpoint of achieving both of the high insulation reliability and the thickness reduction, the thickness "t2" is preferably in the range of 3 to 5 μm. By setting the thickness "t2" to a value within the above range, it is possible to obtain a resin layer 2 having excellent embeddability for the circuit wiring portion 4 at a side of the second resin layer 22 and high insulation reliability.

Such a resin layer 2 in which the core portion 1 is embedded can be formed using a method which will be described below.

Namely, it is possible to use a method in which the first resin composition is applied on a carrier film to produce a carrier member 5a and the second resin composition is applied on another carrier film to produce a carrier member 5b, the carrier members 5a and 5b are laminated on the fiber base member 11, and then the carrier films are removed from the resin compositions. By using such a method, the resin compositions (resin materials) are carried on the fiber base member 11 having the thickness of 25 μm or less, to thereby obtain the above resin layer 2 in which the core portion 1 composed of the fiber base member 11 is embedded.

Figure 4:
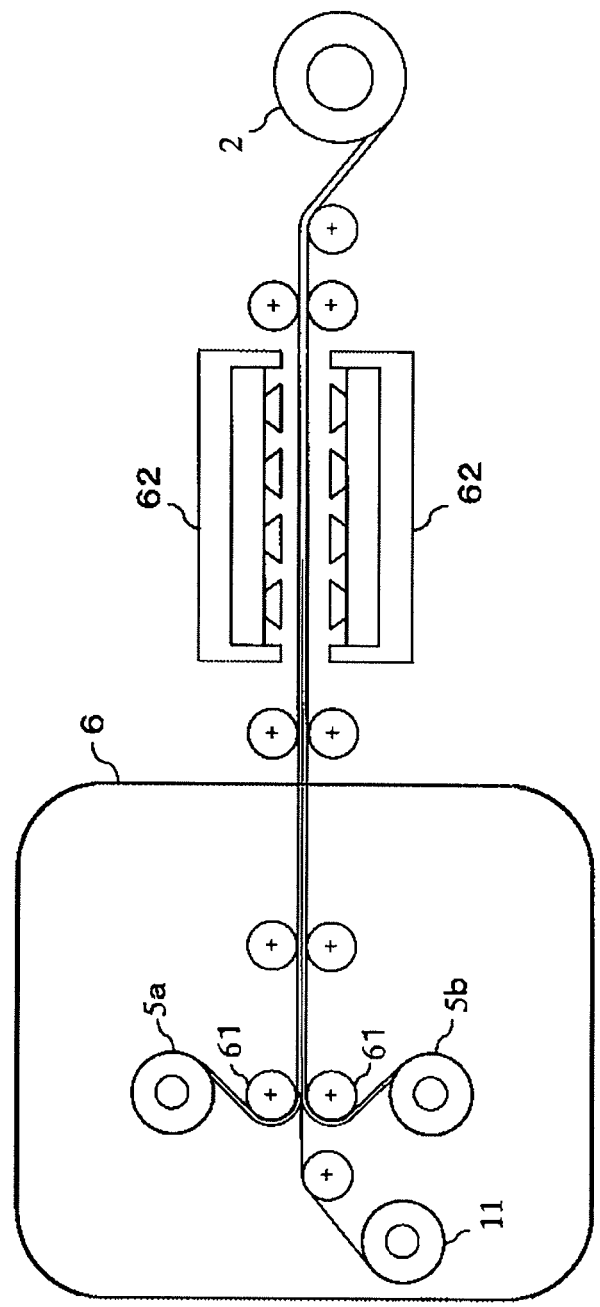
FIG. 4 is a pattern diagram showing a process for forming the resin layer.

Here, description will be concretely made on the method in which the carrier members 5a and 5b are, in advance, produced, the carrier members 5a and 5b are laminated on the fiber base member 11, and then the carrier films are removed from the resin compositions with reference to FIG. 4. FIG. 4 is a process chart showing one example of a process for forming the resin layer 2.

First, the carrier member 5a in which the first resin composition is applied on the carrier film and the carrier member 5b in which the second resin composition is applied on the other carrier film are prepared, respectively.

Next, the carrier members 5a and 5b are laminated on the fiber base member 11 using a vacuum laminator 8 so that the first and second resin compositions make contact with both surfaces of the fiber base member 11 under reduced pressure, respectively, and the carrier members 5a and 5b and the fiber base member 11 are joined together using lamination rolls 61 to thereby obtain a laminate. By joining the carrier members 5a and 5b and the fiber base member 11 together under reduced pressure, even if non-filled portions, which are not filled by the first and second resin compositions, would be produced in the fiber base member 11 or at a joint between the fiber base member 11 and each of the carrier members 5a and 5b, the non-filled portions can exist as decompression voids or substantially vacuum voids. Since such decompression voids or vacuum voids can be removed easily and reliably during a heat treatment which will be described below, a resin layer 2 to be finally obtained can be well molded in a state that such voids are reduced. In this regard, it is to be noted that in order to join the fiber base member 11 and the carrier members 5a and 5b together under reduced pressure, another apparatus such as a vacuum box can be also used.

Next, the laminate in which the fiber base member 11 and the carrier members 5a and 5b are joined together is subjected to a heat treatment using a hot-air drier 62 at a temperature equal to or higher than melting points of the first and second resin compositions each applied on the carrier film. By doing so, even in the case where the decompression voids or the like are produced in the step of joining the fiber base member 11 and the carrier members 5a and 5b together under reduced pressure, it is possible to almost completely remove the decompression voids or the like from the laminate.

The heat treatment can also be carried out by another method using, for example, an infrared heater, a heating roller, a flat plate type hot press machine or the like.

Alternatively, such a resin layer 2 can also be obtained by, for example, applying a resin varnish having a low viscosity on one surface of the fiber base member 11, drying the resin varnish to form the first resin layer 21, applying another resin varnish on the other surface of the fiber base member 11, and drying the resin varnish to form the second resin layer 22.

(Metal Layer)

As shown in FIG. 1, the metal layer 3 is provided on an upper surface of the first resin layer 21 of the resin layer 2 formed in such a way. The opening portions 31 are formed through the metal layer 3 so as to correspond to the via-holes to be formed through the resin layer 2 as described below. Such a metal layer 3 serves as a protective layer which protects the resin layer 2 when forming the via-holes therethrough using irradiation of laser. This makes it possible to prevent the upper surface of the resin layer 2 from being deteriorated due to generation of an interference wave of the laser.

A thickness of the metal layer 3 is not particularly limited to a specific value, but is 5 μm or less, and more preferably in the range of 2 to 4 μm. By setting the thickness of the metal layer 3 to a value within the above range, it is possible to easily remove (peel off) the metal layer 3 from the resin layer 2 when finally manufacturing the substrate.

Examples of such a metal layer 3 include a metal foil capable of peeling off (e.g., peelable copper foil), a metal layer formed by an electrolytic plating, a metal layer formed by an electroless plating, and the like. Among them, the metal foil capable of peeling off (especially, peelable copper foil) is preferably used. By using the metal foil capable of peeling off, the metal layer 3 can be formed in a short period of time and in a high dimensional accuracy as compared with the metal layer formed by the plating.

Examples of a metal constituting the metal layer 3 include copper, copper-based alloy, aluminium, aluminium-based alloy, and the like. In the case where the laminated body 10 is used for manufacturing a device to be applied to a high-frequency application without peeling off the metal layer 3 from the resin layer 2, the copper or the copper-based alloy, which has electric conductivity higher than the aluminium or the aluminium-based alloy, is preferably used as the metal constituting the metal layer 3.

Examples of a method of bonding the metal layer 3 to the resin layer 2 include a vacuum pressing method, a laminating method, and the like. Among these methods, the vacuum pressing method is preferably used. This makes it possible to improve adhesion strength between the metal layer 3 and the resin layer 2.

Since the resin layer 2 includes the core portion 1 composed of the fiber base member, occurrence of cracks and the like can be suppressed within the resin layer 2 of the laminated body 10 obtained in this way. Further, the use of such a laminated body 10 makes it possible to appropriately manufacture a substrate having a thinner thickness. In addition, since the metal layer 3 has the opening portions 31 corresponding to the via-holes to be formed through the resin layer 2, the laminated body 10 can have an excellent laser workability when forming the via-holes.

(Manufacture of Laminated Body)

Next, description will be made on one example of a method of manufacturing such a laminated body 10.

Figure 5:
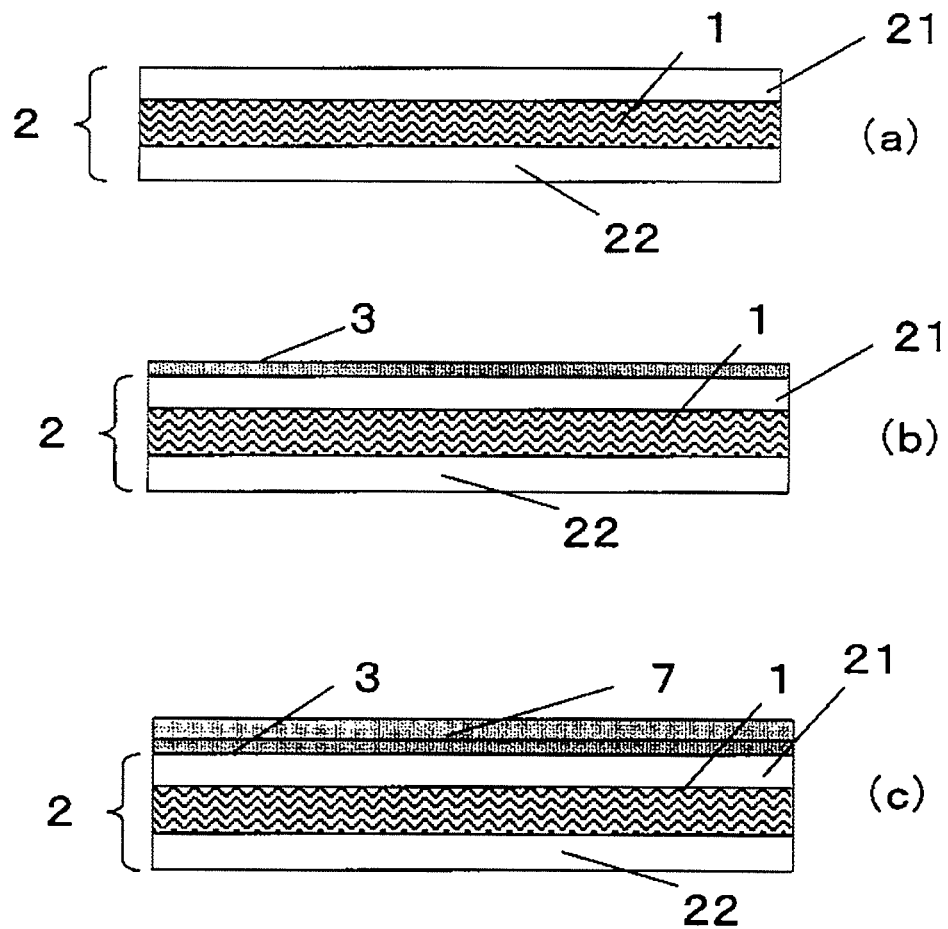
FIGS. 5(a) to 5(c) are pattern diagrams each showing a step for manufacturing the laminated body.

First, the resin layer 2 in which the core portion 1 composed of the fiber base member is embedded is prepared using the above method (see FIG. 5(a)).

A metal foil is laminated on a side of one surface of such a resin layer 2 using a vacuum pressing method to thereby form the metal layer 3 on the resin layer 2 (see FIG. 5(b)). At this time, in order to improve adhesiveness between the resin layer 2 and the metal layer 3, the one surface of the resin layer 2 is preferably subjected to a roughening treatment using an oxidant such as permanganate, dichromate or the like.

Further, the metal layer 3 may be formed by producing a metal foil on which the first resin composition is applied as the carrier member 5a, and then joining the same to the resin layer 2 including the fiber base member 11 using the lamination rolls 61.

Next, a dry film 7 is attached on a surface of the metal layer 3 (see FIG. 5(c)). The dry film 7 is a photographic sensitive film which becomes either soluble or insoluble against a developing agent due to irradiation of an ultraviolet ray or the like. In this embodiment, the photographic sensitive film which becomes insoluble against the developing agent due to the irradiation of the ultraviolet ray or the like is used as the dry film 7.

Figure 6:
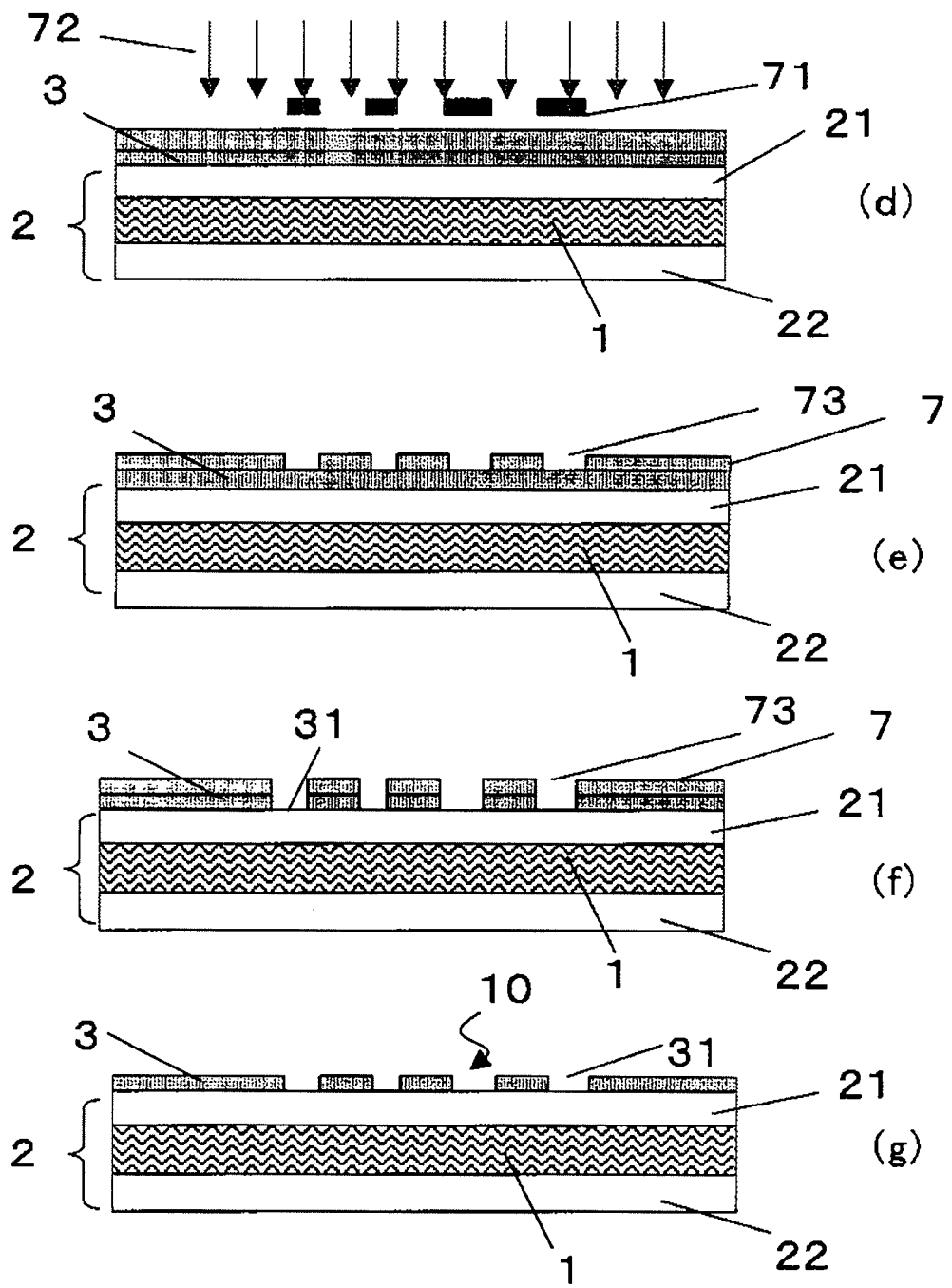
FIGS. 6(d) to 6(g) are pattern diagrams each showing a step for manufacturing the laminated body.

After the dry film 7 is attached on the surface of the metal layer 3, portions of the dry film 7 each corresponding to the opening portions 31 to be formed are covered using a mask 71, and then an ultraviolet ray 72 is irradiated onto the dry film 7 (see FIG. 6(d)). In this way, a portion of the dry film 7 onto which the ultraviolet ray 72 is irradiated is photo-cured so that the photo-cured portion becomes insoluble against the developing agent. Thereafter, the dry film 7 is treated using the developing agent to thereby remove portions onto which the ultraviolet ray 72 is not irradiated (that is, the portions each covered by the mask 71) from the dry film 7. This makes it possible to form portions 73 each corresponding to the opening portions 31 to be formed through the dry film 7 (see FIG. 6(e)). At this time, the metal layer 3 is exposed inside these portions 73 of the dry film 7. The dry film 7 through which the portions 73 are formed serves as a mask for an etching treatment in the following step.

Next, the metal layer 3 is subjected to the etching treatment to remove portions of the metal layer 3 exposed inside the portions 73 of the dry film 7 from the metal layer 3 so that the opening portions 31 are formed through the metal layer 3 (see FIG. 6(f)).

Thereafter, the dry film 7 (mask) is removed from the metal layer 2 using a parting agent to thereby obtain the laminated body 10 (see FIG. 6(g)).

(Method of Manufacturing Substrate)

Next, description will be made on one example of a method of manufacturing the substrate.

Figure 7:
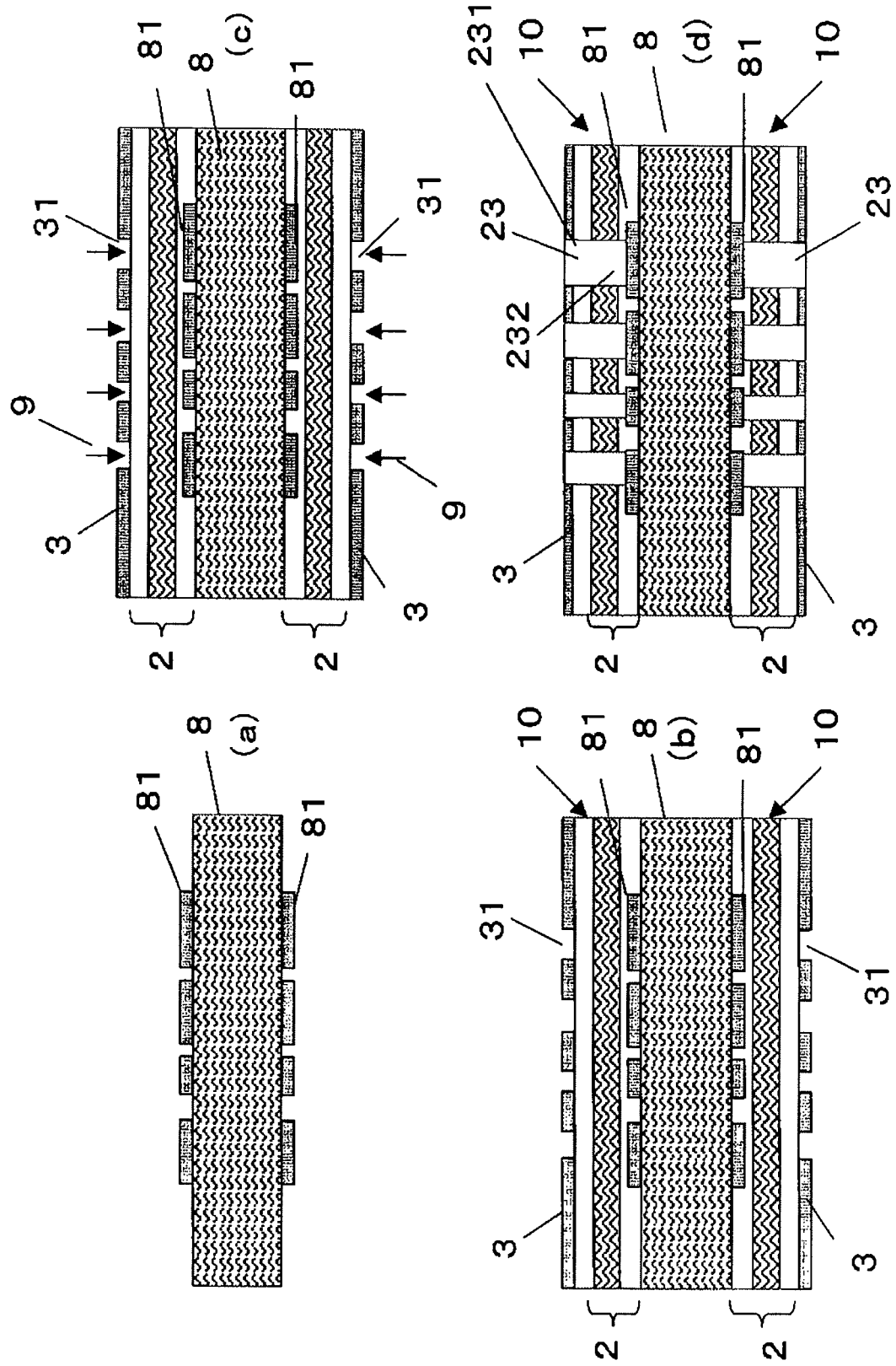
FIGS. 7(a) to 7(d) are pattern diagrams each showing a step for manufacturing a substrate.

First, a core substrate 8 which circuit wiring portions (circuit patterns) 81 are formed on both surfaces thereof is prepared (see FIG. 7(a)). Next, the laminated bodies 10 are laminated onto the circuit wiring portions 81 of the core substrate 8, respectively (see FIG. 7(b)). Examples of a method of laminating the laminated bodies 10 onto the circuit wiring portions 81 include a vacuum pressing method, a laminating method, and the like. Among these methods, the vacuum pressing method is preferably used. This makes it possible to improve adhesion strength between the circuit wiring portion 81 and the resin layer 2.

In this regard, in order to improve adhesiveness between the core substrate 8 and the laminated bodies 10, surfaces of the core substrate 8 are preferably subjected to a roughening treatment using an oxidant such as permanganate, dichromate or the like.

Next, laser 9 is irradiated inside the opening portions 31 of the metal layer 3 (see FIG. 7(c)) so that via-holes 23 are formed through the resin layers 2 (see FIG. 7(d)). By using such a method, it is possible to form the via-holes 23 in an excellent laser workability. Namely, since the metal layers 3 are provided on the resin layers 2 so as to cover surrounds of portions to be removed for forming the via-holes 23, it is possible to prevent the surrounds of the portions from being deteriorated due to generation of an interference wave of the laser 9 or the like (that is, it is possible to prevent openings of the via-holes 23 from being needlessly enlarged). In addition, it is also possible to suppress generation of smear.

Examples of the laser 9 to be used include $CO_2$ laser, UV-YAG laser, and the like.

Further, it is preferred that the laser 9 is irradiated under the conditions that it passes through the resin layer 2 so as to reach the circuit patterns 81 of the core substrate 8. This makes it possible to reduce an effect of the interference wave of the laser 9 on the resin layers 2.

An opening diameter of an upper side 231 (opposite side from the core substrate 8) of each via-hole 23 is not particularly limited to a specific value, but is preferably in the range of 55 to 85 μm, and more preferably in the range of 60 to 70 μm. On the other hand, an opening diameter of a lower side 232 (side near the core substrate 8) of each via-hole 23 is not particularly limited to a specific value, but is preferably in the range of 35 to 65 μm, and more preferably in the range of 50 to 60 μm. By setting the opening diameter of each via-hole 23 to a value within the above range, it is possible to especially improve embeddability of conductors for the via-holes 23.

Figure 8:
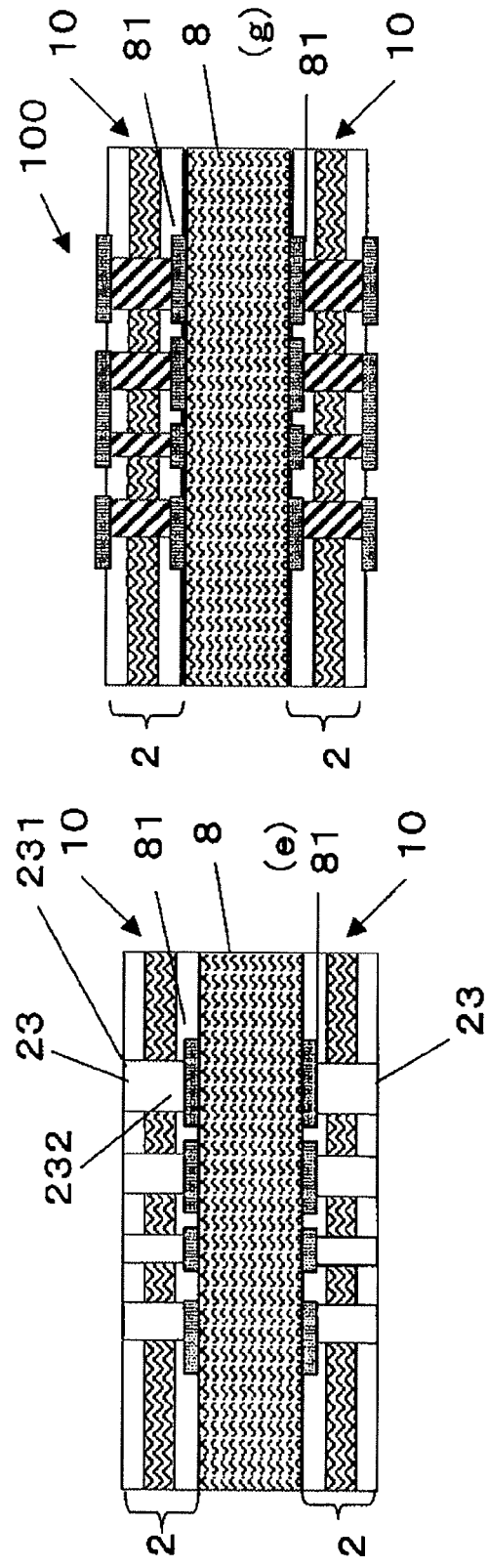
FIGS. 8(e) to 8(g) are pattern diagrams each showing a step for manufacturing the substrate.
Figure 8:
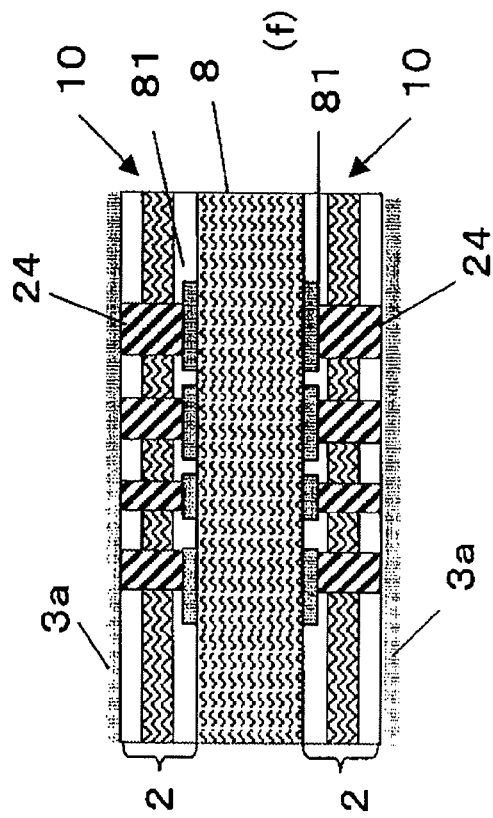

After the laser 9 is irradiated, the metal layers 3 are removed from the resin layers 2, respectively (see FIG. 8(e)). Next, cylindrical conductors 24 are formed into the via-holes 23, respectively, and then metal layers 3a are formed onto surfaces of the resin layers 2, respectively (see FIG. 8(f)). Examples of a method of forming the conductors 24 include a method in which a conductive paste is filled into the via-holes 23, a method in which a conductive material is filled into the via-holes 23 using an electroless plating, a method in which a conductive material is filled into the via-holes 23 using an electrolytic plating, and the like. Among them, the method in which the conductive material is filled into the via-holes 23 using the electrolytic plating is preferably used. The use of such a method is preferable in that the metal layers 3a can be formed on the surfaces of the resin layers 2 while forming the conductors 24 into the via-holes 23.

Thereafter, the metal layers 3a are subjected to an etching treatment or the like so that they are transformed into circuit patterns. In this way, predetermined portions of the circuit patterns are conducted (connected) to the conductors 24 to thereby obtain a multilayer wiring board (substrate) 100 (see FIG. 8(g)). Such a multilayer wiring substrate 100 is referred to as a so-called "1-2-1 substrate". In this embodiment, a case that a single resin layer (buildup layer) is provided on one side of the core substrate 8 has been described, but two or more of the resin layers may be provided on the one side of the core substrate 8. In the case where the two or more of the resin layers are provided on the one side of the core substrate 8, a multilayer wiring board can be obtained by repeating the steps shown in FIGS. 7(b) to 8(g).

Since in the substrate obtained in such a way, the thermal expansion coefficient of the resin layer 2 constituting the substrate is small, it is possible to reduce an expansion coefficient of the substrate as a whole. This makes it possible to reduce occurrence of a warp or the like of the substrate when a semiconductor element or the like is mounted onto the substrate.

Next, description will be made on the semiconductor device.

Figure 9:
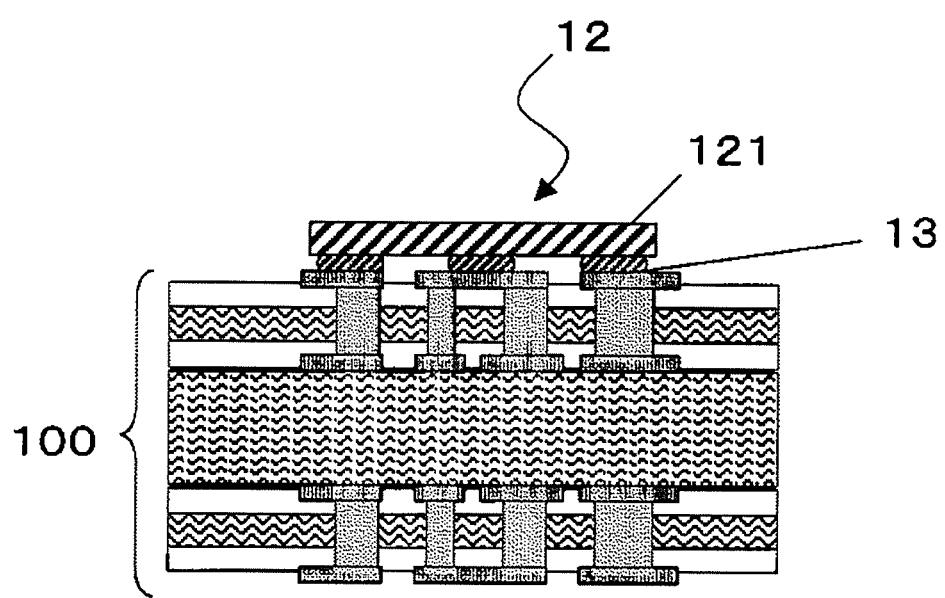
FIG. 9 is a sectional view showing one example of a semiconductor device.

As shown in FIG. 9, a semiconductor device 12 comprises a semiconductor element 121 and the multilayer wiring substrate (1-2-1 substrate) 100 described above.

The semiconductor element 121 is mounted on an upper side in FIG. 9 (one surface side) of the multilayer wiring substrate 100. The semiconductor element 121 and the multilayer wiring substrate 100 are conducted together by connecting predetermined terminals together through solder bumps 13.

EXAMPLES

Hereinbelow, the present invention will be described in detail based on the following Examples and Comparative Examples, but the present invention is not limited to these Examples.

Example 1

(1) Preparation of Resin Varnish

Novolak type cyanate resin having a weight average molecular weight of about 700 ("Primaset PT-30" produced by LONZA Japan): an amount thereof with respect to a total weight of a resin composition was 23.98 wt %; biphenyl dimethylene type epoxy resin having an epoxy equivalent of 275 and a weight average molecular weight of about 2,000 ("NC-3000" produced by Nippon Kayaku Co., Ltd.): an amount thereof with respect to the total weight of the resin composition was 17.98 wt %; phenoxy resin being a copolymer of biphenyl epoxy resin and bisphenol S epoxy resin, having an epoxy group at each end and having a weight average molecular weight of 30,000 ("YX-8100H30" produced by Japan Epoxy Resins Co., Ltd.): an amount thereof with respect to the total weight of the resin composition was 5.99 wt %; phenoxy resin being a copolymer of bisphenol A and bisphenol F and having a weight average molecular weight of 60,000 ("jER4275" produced by Japan Epoxy Resins Co., Ltd.): an amount thereof with respect to the total weight of the resin composition was 11.99 wt %; and an imidazole compound ("CURAZOLE 1B2PZ (1-benzyl-2-phenyl imidazole" produced by Shikoku Chemicals Corporation): an amount thereof with respect to the total weight of the resin composition was 0.66 wt % were dissolved and dispersed into methyl ethyl ketone to obtain a mixture. Further, an inorganic filler being spherical molten silica and having an average particle size of 0.5 μm ("SO-25R" produced by Admatechs Co., Ltd.): an amount thereof with respect to the total weight of the resin composition was 40 wt %; and a coupling agent being an epoxy silane type coupling agent ("A-187" produced by GE Toshiba Silicones): an amount thereof was 0.5 part by weight with respect to 100 parts by weight of the inorganic filler were added to the mixture, and then it was stirred using a high speed stirring machine for 10 minutes. In this way, a resin varnish was prepared.

(2) Preparation of Carrier Member

A polyethylene terephthalate film ("SFB-38" produced by Mitsubishi Polyester Film Corporation) having a thickness of 38 μm and a width of 480 mm was prepared as a carrier film, and the resin varnish prepared above was applied on the carrier film using a comma coater and was then dried using a drier at 170° C. for 3 minutes. In this way, a carrier member 5a was obtained. In this regard, it is to be noted that in the thus obtained carrier member 5a, a resin layer (that is, a resin layer eventually used as a first resin layer) having a thickness of 11 μm and a width of 410 mm was centrally located on the carrier film in a width direction thereof.

Further, a carrier member 5b was obtained in the same manner as in the case of the carrier member 5a except that an amount of the resin varnish was changed. In this regard, it is to be noted that in the thus obtained carrier member 5b, a resin layer (that is, a resin layer eventually used as a second resin layer) having a thickness of 4 μm and a width of 360 mm was centrally located on the carrier film in a width direction thereof.

(3) Formation of Resin Layer

First, a glass woven cloth which was a fiber base member was prepared as a constituent material of a core portion. In this regard, it is to be noted that the glass woven cloth was produced by Nitto Boseki Co., Ltd. and had a cloth type of #1015, a width of 360 mm, a thickness of 15 μm and a basis weight of 17 g/m². Next, a resin layer was formed using a vacuum laminator and a hot air drier each shown in FIG. 4.

More specifically, the carrier member 5a was laminated on one surface of the glass woven cloth and the carrier member 5b was laminated on the other surface of the glass woven cloth so that the carrier members 5a and 5b are centrally located in a width direction of the glass woven cloth, and then the carrier member 5a, the carrier member 5b and the glass woven cloth were joined together using laminating rolls at 80° C. under reduced pressure of 750 Torr to obtain a laminate.

In this regard, it is to be noted that, in an inside area of the laminate that lay within the width of the glass woven cloth, the resin layer of the carrier member 5a was joined to the one surface of the glass woven cloth and the resin layer of the carrier member 5b was joined to the other surface of the glass woven cloth, and in an outside area of the laminate that did not lie within the width of the glass woven cloth, the resin layer of the carrier member 5a and the resin layer of the carrier member 5b were joined together.

Next, the thus obtained laminate was passed through a hot air drier kept at 120° C. for 2 minutes using a horizontal conveyor so that the laminate was subjected to a heat treatment without applying pressure to thereby obtain a resin layer having a thickness of 30 μm (a thickness of the first resin layer was 11 μm, a thickness of the glass woven cloth was 15 μm and a thickness of the second resin layer was 4 μm).

(4) Manufacture of Laminated Body

One of the polyethylene terephthalate films was removed from the obtained resin layer, and then a peelable copper foil (a thickness thereof was 18 μm) as a metal layer was laminated to the resin layer using a vacuum pressing method.

Next, a surface of the metal layer was subjected to a roughening treatment, and then a photographic sensitive dry film ("AR-320" produced by TOKYO OHKA KOGYO CO., LTD.) was attached on the surface treated. Thereafter, portions of the dry film corresponding to opening portions to be formed through the metal layer (via-holes to be formed through the resin layer) were covered using a mask material, and then an ultraviolet ray was irradiated onto the dry film using a compact exposure machine ("EV-0800" produced by ONO SOKKI CO., LTD.). In this way, a portion of the dry film onto which the ultraviolet ray was irradiated was photocured and portions of the dry film onto which the ultraviolet ray was not irradiated by being covered with the mask material were not photo-cured. Next, the dry film was subjected to a developing treatment using a developing solution (1% sodium carbonate aqueous solution) to thereby remove the portions of the dry film onto which the ultraviolet ray was not irradiated. Next, portions of the metal layer exposed through the dry film were removed using an etching treatment liquid to form the opening portions through the metal layer, and then the dry film was removed from the metal layer to thereby obtain a laminated body.

(5) Manufacture of Substrate

A core substrate having circuit patterns (circuit wiring portions) formed on both surfaces thereof ("product number 4785GS" produced by SUMITOMO BAKELITE Co., Ltd.) was prepared, and then the above laminated bodies were laminated on the both surfaces of the core substrate using a vacuum pressing method. Next, laser was irradiated onto the resin layers of the laminated bodies in order to form via-holes through the resin layers. In this regard, it is to be noted that the irradiation of the laser was carried out using a $CO_2$ laser processing machine (produced by Mitsubishi Electric Corporation) under the processing conditions that a pulse width of the laser was 5 μs, reference energy thereof was 2.0 mJ and a shot number thereof was 3. In this way, via-holes 23 each having an opening diameter of an upper side (opposite side from the core substrate) of 60 to 70 μm and an opening diameter of a lower side (side near the core substrate) of 50 to 60 μm were formed through the resin layers. Next, the metal layers were subjected to an etching treatment to thereby remove them from the resin layers, respectively.

After the etching treatment, an electrolytic plating was carried out in order to produce an interlayer connection. More specifically, the core substrate with the resin layers was immersed into a copper sulfate solution (produced by OKUNO CHEMICAL INDUSTRIES CO., LTD.), a pair of anodes were set through the core substrate in the copper sulfate solution so as to be parallel to the core substrate, and then direct current having 20 A was applied between the core substrate and the anodes for 2 hours. In this way, copper layers each having 25 μm were formed on surfaces of the resin layers, respectively, while embedding copper into the via-holes.

Further, the same step as described above was carried out once again to thereby obtain a 1-2-1 substrate.

(6) Manufacture of Semiconductor Device

A semiconductor element was mounted onto the obtained 1-2-1 substrate to thereby obtain a semiconductor device. More specifically, the semiconductor device was manufactured by bonding the semiconductor element to a surface of the substrate through solder balls, and then applying a sealing resin composition between the substrate and the semiconductor element to form an underfill portion.

In this regard, a plurality of the substrates and semiconductor devices were manufactured in the same manner as described above.

Example 2

This Example 2 was carried out in the same manner as in the Example 1 except that a fiber base member having a thickness of 20 μm was used.

Example 3

This Example 3 was carried out in the same manner as in the Example 1 except that an organic non-woven cloth having a thickness of 15 μm ("product number MBBK6C" produced by KUPARAY CO., LTD.) was used as the constituent material of the core portion.

Example 4

This Example 4 was carried out in the same manner as in the Example 1 except that the thickness of the first resin layer was changed to 7.5 μm and the thickness of the second resin layer was changed to 7.5 μm.

Example 5

This Example 5 was carried out in the same manner as in the Example 1 except that the resin varnish was prepared by using epoxy resin instead of the cyanate resin and setting an amount thereof with respect to the total weight of the resin composition to 41.96 wt %.

Comparative Example 1

This Comparative Example 1 was carried out in the same manner as in the Example 1 except that the step of forming the metal layer was omitted in the manufacture of the laminated body.

Comparative Example 2

This Comparative Example 2 was carried out in the same manner as in the Example 1 except that the fiber base member which was the constituent material of the core portion was not used.

Comparative Example 3

This Comparative Example 3 was carried out in the same manner as in the Example 1 except that a fiber base member having a thickness of 50 μm, a cloth type of #1080 and a basis weight of 47 g/m² (produced by Nitto Boseki Co., Ltd.) was used.

Each of the substrates and semiconductor devices obtained in the Examples 1 to 5 and the Comparative Examples 1 to 3 were evaluated in the following manner. Evaluation results are shown in Table 1 together with evaluation items.

1. Laser Workability

Laser workability was evaluated by checking existence or nonexistence of smear residues using SEM at a magnification of 10,000 times after forming the via-holes. In this regard, it is to be noted that symbols A to D shown in Table 1 indicate the following contents.

A: The smear residues hardly exist.
B: The smear residues exist at bottoms of the via-holes.
C: The smear residues exist on surfaces of the resin layer or inner circumference surfaces defining the via-holes.
D: The via-holes could not be formed through the resin layers.

2. Thermal Expansion Coefficient of Substrate in Plane Direction

An evaluation sample having a size of 4 mm×20 mm was obtained from a resin cured product of the substrate. A thermal expansion coefficient of the evaluation sample was measured using a TMA instrument (produced by TA Instrument) at a temperature rise rate of 10° C./min. In this regard, it is to be noted that a value of "α1" is a thermal expansion coefficient of the evaluation sample at a temperature of a glass transition temperature thereof or less.

3. Anti-Cracking Property after Carrying Out Reflow Test

After the obtained semiconductor device was subjected to a pre-treatment under the conditions that a temperature was 30° C., a humidity of 60% and a time of 168 hours, and then was subjected to a reflow test at a peak temperature of 260° C. thrice, occurrence of cracks (peelings) was checked using ultrasonic wave detection equipment. In this regard, this evaluation was carried out on four semiconductor devices obtained in each of the Examples and Comparative Examples. This result is indicated as "number of good-quality articles/total number of semiconductor devices" in Table 1.

4. Anti-Cracking Property after Carrying Out Thermal Cycle Test

After the obtained semiconductor device was subjected to a thermal cycle test by repeating 500 cycles each consisting of 30-minute cooling at −50° C. and 30-minute heating at 125° C., occurrence of cracks (peelings) was checked using ultrasonic wave detection equipment. In this regard, this evaluation was carried out on four semiconductor devices obtained in each of the Examples and Comparative Examples. This result is indicated as "number of good-quality articles/total number of semiconductor devices" in Table 1.

[Table 1]

TABLE 1

|  | Smear residues | Thermal expansion coefficient (x direction) α1 (ppm) | Anti-cracking property after carrying out reflow test | Anti-cracking property after carrying out thermal cycle test |
| --- | --- | --- | --- | --- |
| Ex. 1 | A | 11 | 4/4 | 4/4 |
| Ex. 2 | B | 10 | 4/4 | 4/4 |
| Ex. 3 | A | 15 | 3/4 | 3/4 |
| Ex. 4 | A | 11 | 4/4 | 4/4 |
| Ex. 5 | A | 30 | 2/4 | 2/4 |
| Comp. Ex. 1 | D | 11 | 3/4 | 3/4 |
| Comp. Ex. 2 | B | 40 | 0/4 | 0/4 |
| Comp. Ex. 3 | C | 10 | 4/4 | 4/4 |

As can be seen from Table 1, in the resin layers of the substrates obtained in the Examples 1 to 5, an amount of the smear residues was very small. This means that the laminated bodies of the present invention had excellent laser workability.

Further, the substrates obtained in the Examples 1 to 4 had specific low thermal expansion coefficient. This suggests that occurrence of warps of the substrates is prevented when the semiconductor elements have been mounted thereon.

Furthermore, the substrates obtained in the Examples 1 to 4 had specific excellent anti-cracking properties even after carrying out the reflow test and the thermal cycle test.

INDUSTRIAL APPLICABILITY

According to the present invention, it is possible to improve laser workability of a resin layer by sufficiently suppressing generation of smear during subjecting the resin layer to the laser processing.

Further, in the case where cyanate resin is used for forming the resin layer, a thermal expansion coefficient of the resin layer can be reduced. This makes it possible to suppress occurrence of a warp of a substrate manufactured using the resin layer. Thus, the present invention has industrial applicability.

What is claimed is:

1. A laminated body, comprising:
   a circuit wiring portion; a resin layer provided on the circuit wiring portion, the resin layer including a core portion composed of a fiber base member having a thickness of 25 μm or less, the core portion having a center line in a thickness direction thereof, the resin layer having one surface, the other surface opposite to the one surface and a center line in a thickness direction thereof, and the resin layer through which at least one via-hole is adapted to be formed; and
   a metal layer bonded to at least one of the two surfaces of the resin layer, and the metal layer having at least one opening portion provided so as to correspond to the via-hole to be formed,
   wherein the center line of the core portion is provided only between the center line of the resin layer and the one surface of the resin layer and no center line of the core portion is provided between the center line of the resin layer and the other surface of the resin layer, wherein the resin layer includes the core portion having one surface and the other surface opposite to the one surface, a first resin layer provided on a side of the one surface of the core portion, and a second resin layer provided on a side of the other surface of the core potion, and wherein in the case where a thickness of the first resin layer is defined as "B2 (μm)", a thickness of the second resin layer which is not positioned between the circuit wiring portion and the core portion is defined as "B1 (um)", a thickness of the circuit wiring portion is defined as "t1 (μm)", a residual copper ratio of the circuit wiring portion is defined as "S (%)", and a thickness of the second resin layer which is positioned between the circuit wiring portion and the core portion is defined as "t2 (μm)", B1, B2, t1 and t2 satisfy a relationship of $B2<B1$ and $B1=t2+t1\times(1-S/100)$.

2. The laminated body as claimed in claim 1, wherein the fiber base member is a glass fiber base member and a glass material for forming the glass fiber member is T glass.

3. The laminated body as claimed in claim 1, wherein a metal constituting the metal layer is at least one of copper and copper-based metal alloy.

4. The laminated body as claimed in claim 1, wherein the resin layer is formed of a resin composition containing cyanate resin and a weight average molecular weight of the cyanate resin is in the range of 500 to 4,500.

5. The laminated body as claimed in claim 1, wherein the first resin layer has a thickness of 5 to 15 μm, and a second resin layer has a thickness of 15 to 50 μm.

6. The laminated body as claimed in claim 1, wherein a first resin composition constituting the first resin layer is different from a second composition constituting the second resin layer.

7. A method of manufacturing a substrate, comprising:
preparing the laminated body defined by claim 1;
forming the via-hole so as to pass through the resin layer by irradiating a laser beam onto the resin layer; and
removing the metal layer from the resin layer after the via-hole is formed.

8. The method as claimed in claim 7, wherein the via-hole has a first opening positioned on a side of the metal layer and having a diameter of 55 to 85 μm and a second opening positioned on an opposite side from the metal layer and having a diameter of 35 to 65 μm.

9. A substrate manufactured by using the method defined by claim 7.

10. A substrate, comprising:
a core substrate having two surfaces;
a circuit wiring portion formed on a side of at least one of the two surfaces of the core substrate; and
a resin layer provided on the circuit wiring portion, the resin layer having one surface, the other surface opposite to the one surface and a center line in a thickness direction thereof,
wherein the resin layer includes a core portion composed of a fiber base member, the core portion having a thickness of 25 μm or less and having one surface and the other surface opposite to the one surface, a first resin layer formed on a side of the one surface of the core portion, and a second resin layer formed on a side of the other surface of the core portion, the core portion has a center line in a thickness direction thereof, the circuit wiring portion is provided so as to be embedded into a part of the second resin layer, and the center line of the core portion is provided only between the center line of the resin layer and the one surface of the resin layer and no center line of the core portion is provided between the center line of the resin layer and the other surface of the resin layer, and wherein in the case where a thickness of the first resin layer is defined as "B2 (μm)", a thickness of the second resin layer which is not positioned between the circuit wiring portion and the core portion is defined as "B1 (um)", a thickness of the circuit wiring portion is defined as "t1 (μm)", a residual copper ratio of the circuit wiring portion is defined as "S (%)", and a thickness of the second resin layer which is positioned between the circuit wiring portion and the core portion is defined as "t2 (μm)", B1, B2, t1 and t2 satisfy a relationship of $B2<B1$ and $B1=t2+t1\times(1-S/100)$.

11. A semiconductor device, comprising:
the substrate defined by claim 9; and
a semiconductor element mounted on the substrate.

12. The laminated body as claimed in claim 1, wherein the resin layer is formed of a resin composition containing a novolak type cyanate resin represented by the following formula (I):

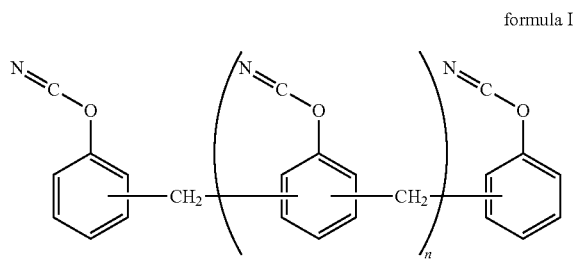

formula I where n is an average number of repeating units of the novolak type cyanate resin and n is an integer of 1 to 10.

* * * * *